(12) United States Patent
Chang et al.

(10) Patent No.: US 11,380,786 B2
(45) Date of Patent: Jul. 5, 2022

(54) INSULATING STRUCTURE OF HIGH ELECTRON MOBILITY TRANSISTOR AND MANUFACTURING METHOD THEREOF

(71) Applicant: UNITED MICROELECTRONICS CORP., Hsin-Chu (TW)

(72) Inventors: Chun-Ming Chang, Kaohsiung (TW); Wen-Jung Liao, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/519,008

(22) Filed: Jul. 23, 2019

(65) Prior Publication Data

US 2021/0013332 A1      Jan. 14, 2021

(30) Foreign Application Priority Data

Jul. 9, 2019   (CN) .......................... 201910613589.5

(51) Int. Cl.
*H01L 29/778*   (2006.01)
*H01L 21/3105*   (2006.01)
*H01L 23/31*   (2006.01)
*H01L 29/66*   (2006.01)

(52) U.S. Cl.
CPC .... *H01L 29/7786* (2013.01); *H01L 21/31055* (2013.01); *H01L 23/3171* (2013.01); *H01L 23/3178* (2013.01); *H01L 29/66462* (2013.01)

(58) Field of Classification Search
CPC ........... H01L 29/7786; H01L 29/66462; H01L 21/31055; H01L 23/3171; H01L 23/3178
USPC .......................................................... 257/76
See application file for complete search history.

(56) References Cited

U.S. PATENT DOCUMENTS

| 7,737,502 | B2 | 6/2010 | Beintner | |
|---|---|---|---|---|
| 2001/0041422 | A1 | 11/2001 | Sawamura | |
| 2009/0242937 | A1* | 10/2009 | Marui | H01L 29/7786 257/192 |
| 2011/0042719 | A1* | 2/2011 | Sazawa | H01L 29/66462 257/190 |
| 2013/0105808 | A1* | 5/2013 | Wong | H01L 29/517 257/76 |
| 2013/0168685 | A1* | 7/2013 | Hsu | H01L 29/2003 257/76 |
| 2013/0256679 | A1* | 10/2013 | Yao | H01L 29/66462 257/76 |
| 2014/0231874 | A1 | 8/2014 | Hoshi | |
| 2015/0349105 | A1* | 12/2015 | Curatola | H01L 29/205 257/76 |
| 2016/0043218 | A1 | 2/2016 | Moens | |

(Continued)

FOREIGN PATENT DOCUMENTS

WO   2019/012293 A1   1/2019

*Primary Examiner* — Khiem D Nguyen
*Assistant Examiner* — Gardner W. S. Swan
(74) *Attorney, Agent, or Firm* — Winston Hsu

(57) ABSTRACT

An insulating structure of a high electron mobility transistor (HEMT) is provided, which comprises a gallium nitride layer, an aluminum gallium nitride layer disposed on the gallium nitride layer, a groove disposed in the gallium nitride layer and the aluminum gallium nitride layer, an insulating layer disposed in the groove, wherein a top surface of the insulating layer is aligned with a top surface of the aluminum gallium nitride layer, and a passivation layer, disposed on the aluminum gallium nitride layer and the insulating layer.

4 Claims, 7 Drawing Sheets

(56) References Cited

U.S. PATENT DOCUMENTS

| | | | |
|---|---|---|---|
| 2016/0079405 A1* | 3/2016 | Saki | H01L 29/66462 |
| | | | 257/76 |
| 2017/0229480 A1 | 8/2017 | Jin | |
| 2017/0236929 A1* | 8/2017 | Green | H01L 21/31116 |
| | | | 257/194 |
| 2019/0035896 A1* | 1/2019 | Chen | H01L 21/8252 |
| 2019/0267482 A1* | 8/2019 | Udrea | H01L 27/0738 |
| 2020/0328296 A1* | 10/2020 | Hwang | H01L 29/2003 |

\* cited by examiner

INSULATING STRUCTURE OF HIGH ELECTRON MOBILITY TRANSISTOR AND MANUFACTURING METHOD THEREOF

BACKGROUND OF THE INVENTION

1. Field of the Invention

The invention relates to an insulating structure of a high electron mobility transistor and a manufacturing method thereof.

2. Description of the Prior Art

Due to their semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different bandgaps are combined and a heterojunction is formed at the junction between the semiconductor materials as a channel for carriers. In recent years, gallium nitride (GaN) based materials have been applied in the high power and high frequency products because of their properties of wider band-gap and high saturation velocity. A two-dimensional electron gas (2DEG) may be generated by the piezoelectricity property of the GaN-based materials, and the switching velocity may be enhanced because of the higher electron velocity and the higher electron density of the 2DEG High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

The present invention provides an insulating structure of a high electron mobility transistor (HEMT), the insulating structure of a HEMT includes a gallium nitride layer, an aluminum gallium nitride layer on the gallium nitride layer, a groove located in the gallium nitride layer and the aluminum gallium nitride layer, an insulating layer located in the groove, wherein a top surface of the insulating layer is aligned with a top surface of the aluminum gallium nitride layer, and a passivation layer on the aluminum gallium nitride layer and the insulating layer.

The present invention provides an insulating structure of a high electron mobility transistor (HEMT), the insulating structure of a HEMT includes a gallium nitride layer, an aluminum gallium nitride layer on the gallium nitride layer, a groove located in the gallium nitride layer and the aluminum gallium nitride layer, a passivation layer located on the aluminum gallium nitride and in the groove, and an insulating layer disposed in the groove and fills up the groove, wherein a top surface of the insulating layer is aligned with a top surface of the passivation layer.

The present invention provides a method of forming an insulating structure of a high electron mobility transistor (HEMT), the method at least includes the following steps: firstly, a gallium nitride layer is formed, next, an aluminum gallium nitride layer is formed on the gallium nitride layer, then, a first patterned photoresist layer is formed on the aluminum gallium nitride layer, and a groove is formed in the gallium nitride layer and the aluminum gallium nitride layer, next, an insulating layer is formed and filling up the groove. Afterwards, a second patterned photoresist layer is formed on the insulating layer, wherein the pattern of the first patterned photoresist layer is complementary to the pattern of the second patterned photoresist layer, and part of the insulating layer is removed, then, the second patterned photoresist layer is removed, and an etching step is performed on the remaining insulating layer to remove part of the insulating layer again.

The present invention is characterized by providing an insulating structure of a high electron mobility transistor (HEMT) and a method for forming the same, wherein an insulating layer of the high electron mobility transistor having a flat surface is formed only by photolithography etching instead of a planarization step (e.g., chemical mechanical polishing). In the absence of a planarization machine, a high electron mobility transistor with high yield can still be fabricated.

These and other objectives of the present invention will no doubt become obvious to those of ordinary skill in the art after reading the following detailed description of the preferred embodiment that is illustrated in the various Figures and drawings.

BRIEF DESCRIPTION OF THE DRAWINGS

FIG. 1 to FIG. 8 are schematic diagrams of a method for manufacturing an insulating structure of a high electron mobility transistor according to the first preferred embodiment of the present invention, in which:

FIG. 2 is a schematic diagram of the step subsequent to FIG. 1;

FIG. 3 is a schematic diagram of the step subsequent to FIG. 2;

FIG. 4 is a schematic diagram of the step subsequent to FIG. 3;

FIG. 5 is a schematic diagram of the step subsequent to FIG. 4;

FIG. 6 is a schematic diagram of the steps after FIG. 5;

FIG. 7 is a schematic diagram of the step subsequent to FIG. 6; and

FIG. 8 is a schematic diagram of the steps after FIG. 7.

FIG. 9 to FIG. 14 are schematic diagrams of a method for manufacturing an insulating structure of a high electron mobility transistor according to the second preferred embodiment of the present invention, in which:

FIG. 9 is a schematic diagram of the step subsequent to FIG. 2;

FIG. 10 is a schematic diagram of the step subsequent to FIG. 9;

FIG. 11 is a schematic diagram of the step subsequent to FIG. 10;

FIG. 12 is a schematic diagram of the step subsequent to FIG. 11;

FIG. 13 is a schematic diagram of the step subsequent to FIG. 12; and

FIG. 14 is a schematic diagram of the steps after FIG. 13.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the Figures are only for illustration and the Figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
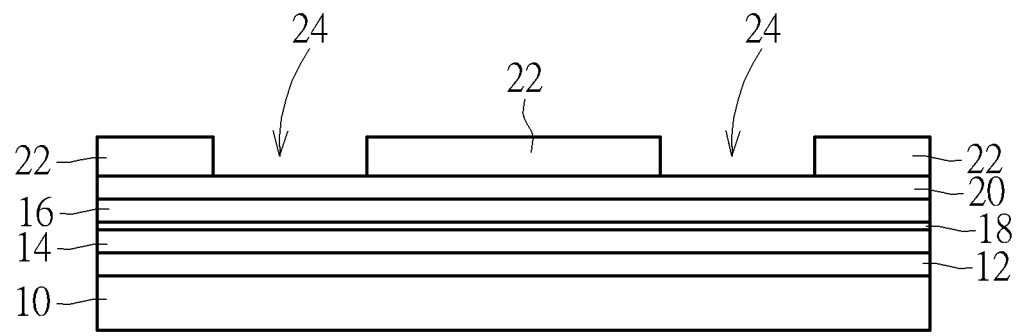
Figure 2:
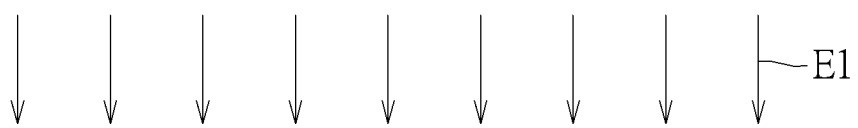
Figure 2:
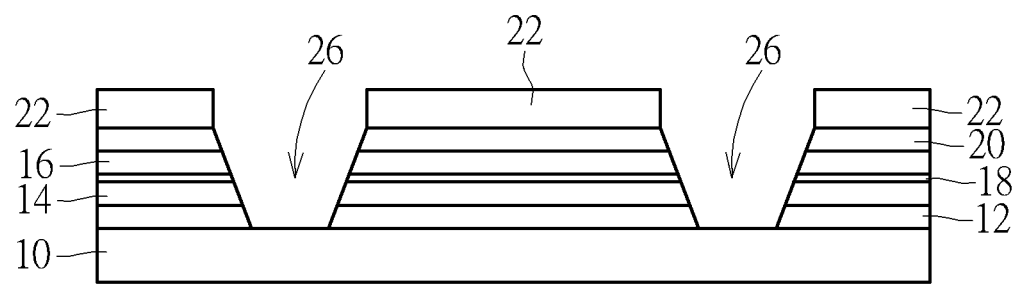
Figure 3:
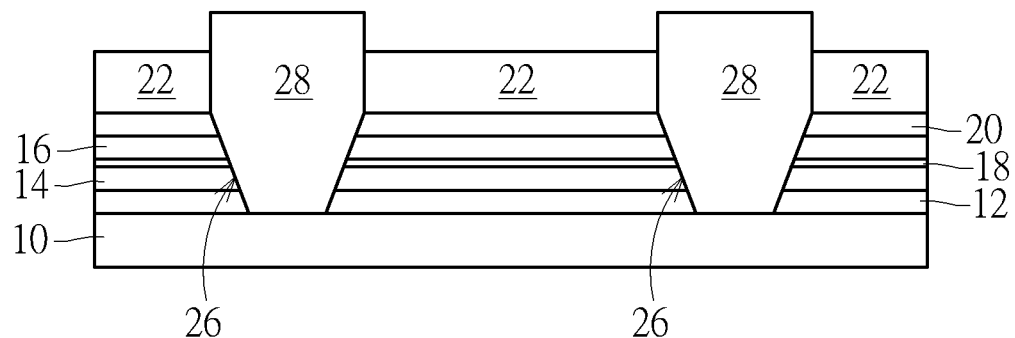
Figure 4:
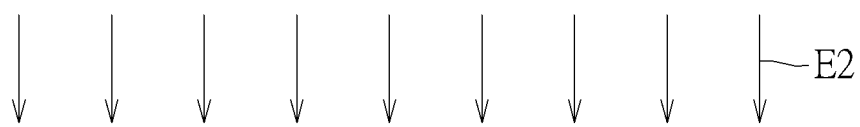
Figure 4:
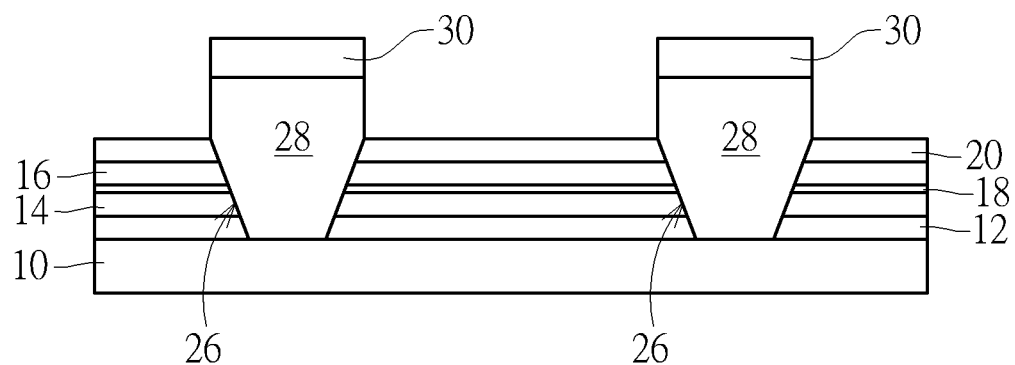
Figure 5:
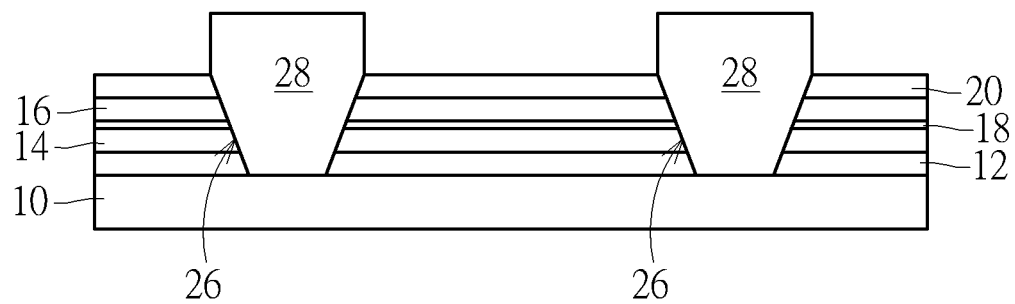
Figure 6:
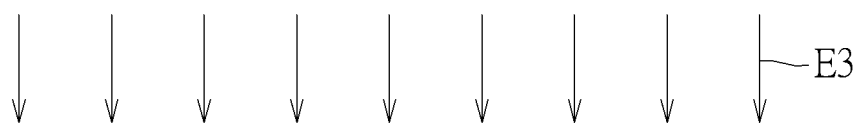
Figure 6:
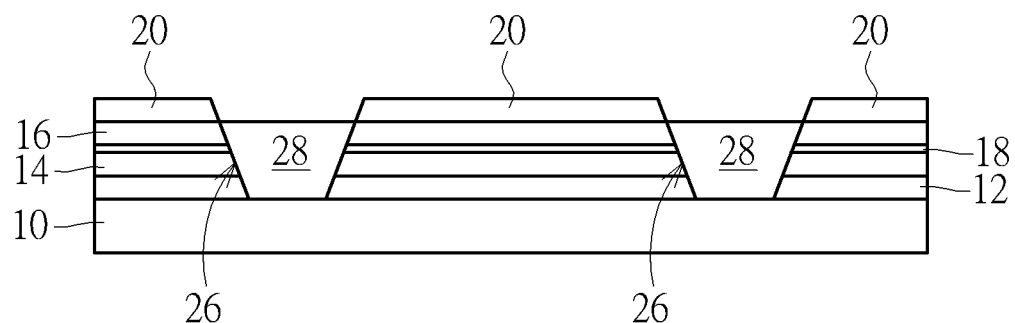
Figure 7:
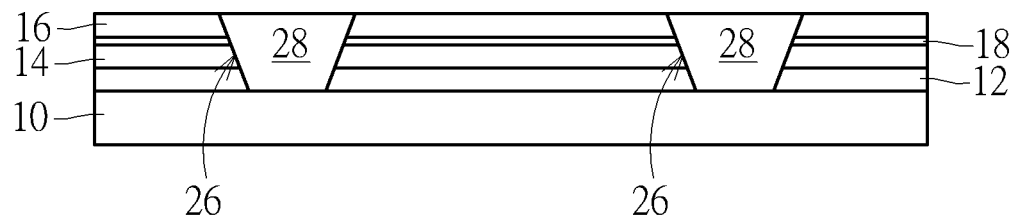
Figure 8:
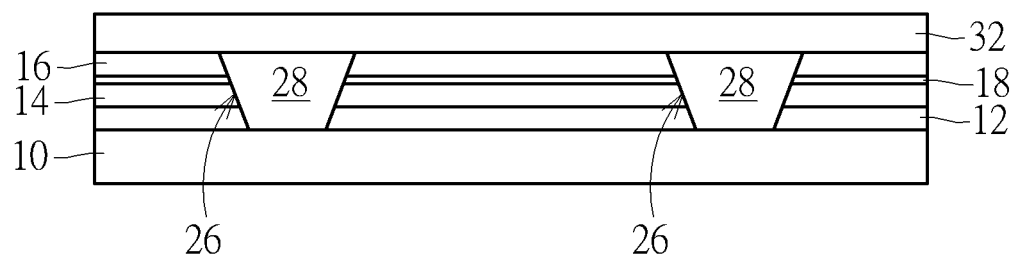

Please refer to FIG. 1 to FIG. 8. FIG. 1 to FIG. 8 are schematic diagrams of a method for manufacturing an insulating structure of a high electron mobility transistor according to the first preferred embodiment of the present invention. FIG. 2 is a schematic diagram of the step subsequent to FIG. 1; FIG. 3 is a schematic diagram of the step subsequent to FIG. 2; FIG. 4 is a schematic diagram of the step subsequent to FIG. 3; FIG. 5 is a schematic diagram of the step subsequent to FIG. 4; FIG. 6 is a schematic diagram of the steps after FIG. 5; FIG. 7 is a schematic diagram of the step subsequent to FIG. 6; and FIG. 8 is a schematic diagram of the steps after FIG. 7. As shown in the FIG. 1, a substrate 10 such as a substrate made from silicon, silicon carbide, or aluminum oxide (or also referred to as sapphire) is provided, in which the substrate 10 could be a single-layered substrate, a multi-layered substrate, gradient substrate, or combination thereof. According to other embodiment of the present invention, the substrate 10 could also include a silicon-on-insulator (SOI) substrate.

Next, a buffer layer 12 is formed on the surface of the substrate 10. The main function of the buffer layer 12 is to help subsequently formed gallium nitride layers to be more easily formed on the substrate 10. For example, if the substrate 10 is a sapphire (alumina) substrate and the lattice constant difference between alumina and gallium nitride is large, a buffer layer 12 needs to be formed between the substrate 10 and the gallium nitride layer, and the lattice constant of the buffer layer 12 is between the lattice constant of the substrate 10 and the lattice constant of gallium nitride. In this embodiment, the buffer layer 12 is, for example, aluminum nitride (AlN), but is not limited thereto.

Next, a gallium nitride (GaN) layer 14 is formed on the buffer layer 12, in which a thickness of the gallium nitride layer 14 could be between 0.5 microns to 10 microns. According to an embodiment of the present invention, the formation of the gallium nitride layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, an aluminum gallium nitride (AlGaN) layer 16 is formed on the surface of the gallium nitride layer 14. In this embodiment, the aluminum gallium nitride layer 16 preferably includes an epitaxial layer formed through epitaxial growth process. Similar to the gallium nitride layer 14, the formation of the aluminum gallium nitride layer 16 on the gallium nitride layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

It should be noted that after the aluminum gallium nitride layer 16 is formed on the surface of the gallium nitride layer 14, a heterojunction is formed at the interface between the buffer layer and barrier layer as a result of the bandgap difference between the two layers. Essentially a quantum well is formed in the banding portion of the conduction band of the heterojunction to constrain the electrons generated by piezoelectricity so that a channel region or a two-dimensional electron gas (2 DEG) layer 18 is formed at the interface between the gallium nitride layer and the aluminum gallium nitride layer to further form a conduction current.

Next, still referring to FIG. 1, a mask layer 20 and a patterned photoresist layer 22 are sequentially formed on the aluminum gallium nitride layer 16, wherein the mask layer 20 comprises an insulating material such as silicon oxide, silicon nitride or silicon oxynitride. In this embodiment, the mask layer 20 takes silicon nitride as an example, but the present invention is not limited thereto. The patterned photoresist layer 22 may include a positive photoresist or a negative photoresist, and may be patterned according to a photoresist layer (not shown) by an exposure and development step to form the patterned photoresist layer 22. The patterned photoresist layer comprises at least one opening 24, and the position of the opening 24 roughly corresponds to the position where an insulating region needs to be formed subsequently. In other words, in this step, portions that do not need to form insulating regions will be covered by the patterned photoresist 22.

As shown in FIG. 2, an etching step E1 is performed using the patterned photoresist layer 22 as a protective layer to remove part of the mask layer 20, part of the aluminum gallium nitride layer 16, part of the two-dimensional electron gas layer 18, part of the gallium nitride layer 14, and form a groove 26 in each material layer. In some embodiments, if the depth of the groove 26 is sufficient, it may also extend into the buffer layer 12, in other words, during the etching step E1, it may also remove part of the buffer layer 12.

Next, as shown in FIG. 3, an insulating layer 28 is formed to fill up each groove 26. In this step, the insulating layer 28 includes an insulating material such as silicon oxide, silicon nitride or silicon oxynitride. Preferably, the insulating layer 28 and the mask layer 20 comprise different materials. In this embodiment, the insulating layer 28 comprises silicon oxide, but is not limited thereto. After forming the insulating layer 28, a second patterned photoresist layer 30 is additionally formed to cover the surface of the insulating layer 28. It should be noted that the second patterned photoresist layer 30 is complementary to the patterned photoresist layer 22. As used herein, "complementary" means that both the patterned photoresist layer 22 and the second patterned photoresist layer 30 can be combined into a complete photoresist coating layer as viewed from the top view or the cross section. In other words, the position of the second patterned photoresist layer 30 corresponds to the portion of the opening 24 of the patterned photoresist layer 22. In actual production, a same photomask can be used to form the patterned photoresist layer 22 and the second patterned photoresist layer 30, and two different photoresists (e.g., positive photoresists and negative photoresists, respectively, or negative photoresists and positive photoresists, respectively) can be used to form the photoresist layer with complementary patterns.

Referring to FIG. 4 to FIG. 5, as shown in FIG. 4, an etching step E2 is performed, using the second patterned photoresist layer 30 as a protective layer to remove the insulating layer 28 not covered by the second patterned photoresist layer 30. Next, as shown in FIG. 5, another step is performed to remove the second patterned photoresist layer 30, and the top of the remaining insulating layer 28 is preferably higher than the top of the mask layer 20. The method for removing the insulating layer or the patterned photoresist layer includes but is not limited to ashing, photolithography, wet/dry etching, reactive ion etching RIE etch back, and the present invention is not limited thereto. However, it is worth noting that the above method does not include a planarization step (such as chemical mechanical polishing (CMP)). Since the method of removing the insulating layer or the patterned photoresist layer belongs to the known technology in the art, it will not be described in detail here.

As shown in FIG. 6, an etching back step E3 is performed to reduce the height of the insulating layer 28. By adjusting the parameters of the etching back step E3, the height of the insulating layer 28 after etching can be controlled. Preferably, adjusting the height of the insulating layer 28 to be aligned with the top surface of the aluminum gallium nitride layer 16 is conducive to improving the yield of the insulating structure for subsequent fabrication of a high electron mobility transistor (HEMT).

Referring to FIG. 7 to FIG. 8, as shown in FIG. 7, the remaining mask layer 20 is removed and the surface of the aluminum gallium nitride layer 16 is exposed. Next, as shown in FIG. 8, a passivation layer 32 is formed to cover the surface of the aluminum gallium nitride layer 16 and the surface of the remaining insulating layer 28. The passivation layer 32 includes an insulating material such as silicon oxide, silicon nitride or silicon oxynitride. Preferably, the insulating layer 28 and the passivation layer 32 comprise different materials. In this embodiment, the passivation layer 32 comprises silicon oxide or silicon oxynitride, but is not limited thereto. Preferably, during the etching back step E3 described above, the top surface of the insulating layer 28 is adjusted to be aligned with the top surface of the aluminum gallium nitride layer 16 (or to be flush with the top surface of the aluminum gallium nitride layer 16), so that the passivation layer 32 formed in this step will have a flat structure (including a flat bottom surface and a flat top surface). In this way, even if the insulating layer is formed in the groove, uneven contours will not be generated on the surface, which is favorable for subsequent fabrication of high electron mobility transistors.

Subsequently, other processes can be continuously performed on the semiconductor structure that has completed the insulation region, such as forming the gate, source/drain, contact structure, etc. corresponding to the high electron mobility transistor. Since these processes are known in the art, they will not be described in detail here.

Therefore, in one embodiment of the present invention, as shown in FIG. 8, an insulating structure of a high electron mobility transistor (HEMT) is provided, which includes a gallium nitride layer 14, an aluminum gallium nitride layer 16 on the gallium nitride layer 14, a groove 26 in the gallium nitride layer 14 and in the aluminum gallium nitride layer 16, an insulating layer 28, located in the groove 26, wherein a top surface of the insulating layer 28 is aligned with a top surface of the aluminum gallium nitride layer 16, and a passivation layer 32 is located on the aluminum gallium nitride layer 16 and the insulating layer 28.

In some embodiments, a two-dimensional electron gas (2DEG) layer 18 is included between a portion of gallium nitride layer 14 and a portion of aluminum gallium nitride layer 16.

In some embodiments, the two-dimensional electron gas layer 18 is not located in the insulating layer 28.

In some embodiments, a buffer layer 12 is further included below the gallium nitride layer 14.

In some embodiments, the range of grooves 26 includes a portion of gallium nitride layer 14, a portion of aluminum gallium nitride layer 16, and a portion of buffer layer 12.

In some embodiments, the passivation layer 32 and the insulating layer 28 are made of different materials.

It is worth noting that in the processes described in FIG. 1 to FIG. 8 above, planarization steps such as chemical mechanical polishing (CMP) are not used, but other processes such as photolithography or etching back are used to complete the insulating structure of the high electron mobility transistor. In this way, even if the processing equipment is limited (for example, there is no planarization machine), high-quality high electron mobility transistors can still be completed.

The following description will detail the different embodiments of an insulating structure of a high electron mobility transistor and the manufacturing method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 9:
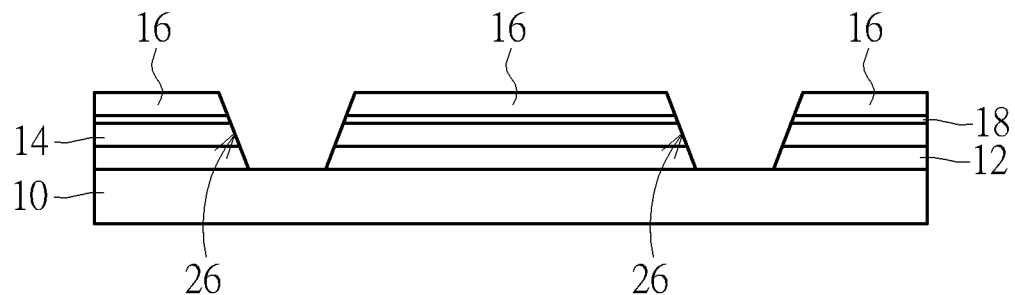
Figure 10:
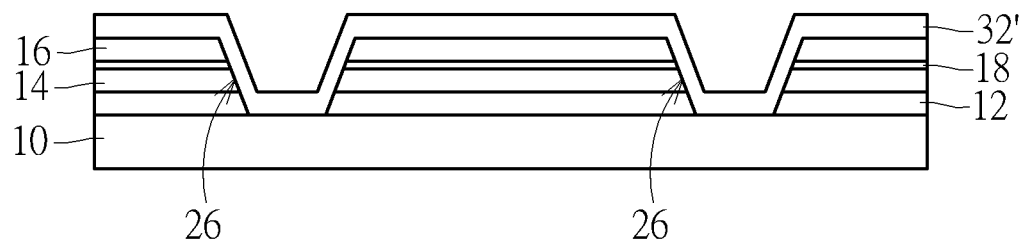
Figure 11:
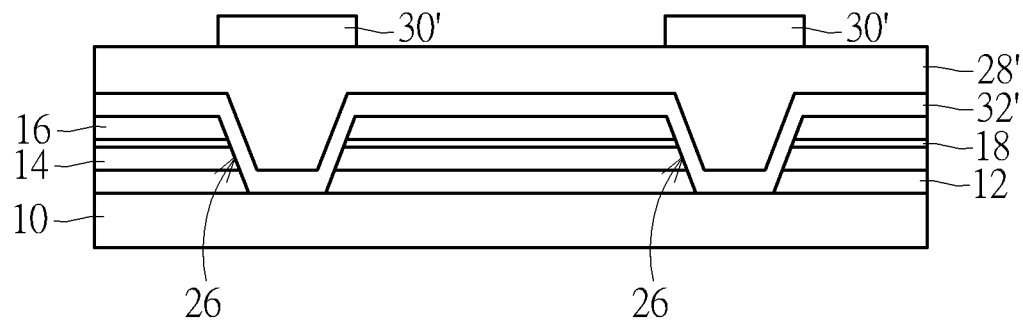
Figure 12:
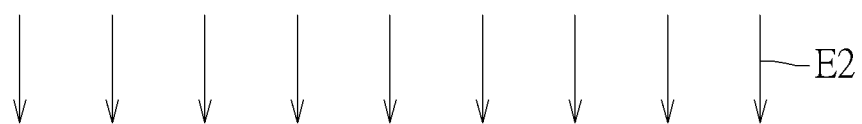
Figure 12:
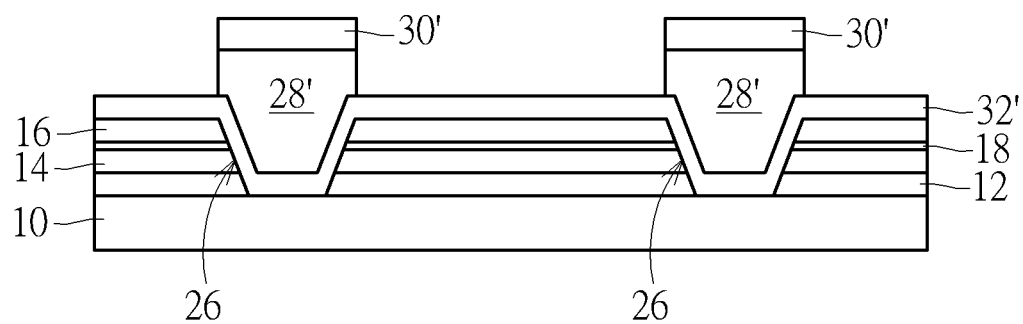
Figure 13:
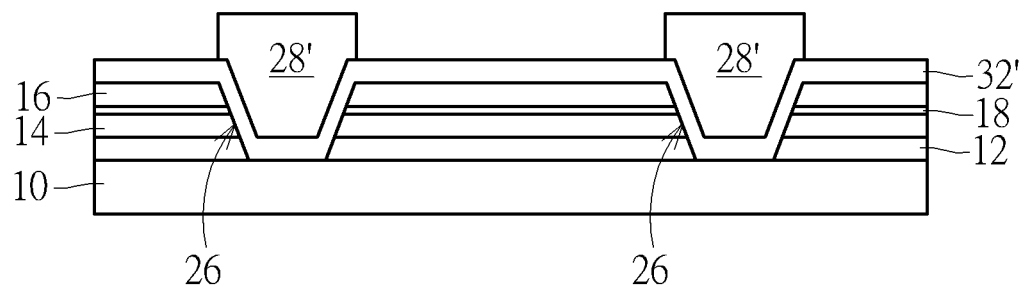
Figure 14:
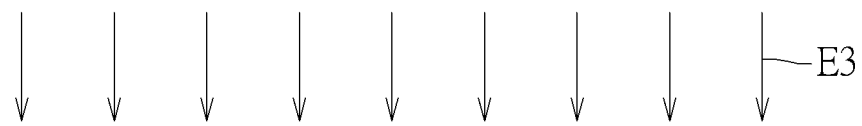
Figure 14:
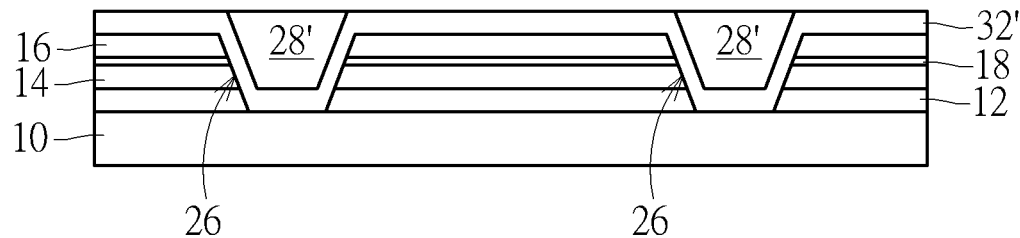

Please refer to FIG. 9 to FIG. 14. FIG. 9 to FIG. 14 are schematic diagrams of a method for manufacturing an insulating structure of a high electron mobility transistor according to the second preferred embodiment of the present invention. The steps of FIG. 9 to FIG. 14 can be continued in succession to FIG. 2 of the first preferred embodiment. FIG. 9 is a schematic diagram of the step subsequent to FIG. 2; FIG. 10 is a schematic diagram of the step subsequent to FIG. 9; FIG. 11 is a schematic diagram of the step subsequent to FIG. 10; FIG. 12 is a schematic diagram of the step subsequent to FIG. 11; FIG. 13 is a schematic diagram of the step subsequent to FIG. 12; and FIG. 14 is a schematic diagram of the steps after FIG. 13.

After FIG. 2, as shown in FIG. 9, the patterned photoresist layer 22 and the mask layer 20 are removed to expose the surface of the aluminum gallium nitride layer 16. The patterned photoresist layer 22 and the mask layer 20 can be removed together in the same etching step or can be removed by different etching steps respectively, and the present invention is not limited thereto. Then, as shown in FIG. 10, a passivation layer 32' is formed to cover the surface of the aluminum gallium nitride layer 16 and to cover the sidewalls and the bottom surface of the groove 26, preferably, the passivation layer 32' does not fill up the groove 26.

As shown in FIG. 11, an insulating layer 28' is formed to fill up each groove 26 and cover the passivation layer 32'. In this step, the insulating layer 28' comprises an insulating material such as silicon oxide, silicon nitride, silicon oxynitride, etc. After forming the insulating layer 28, a second patterned photoresist layer 30' is additionally formed to cover the surface of the insulating layer 28. It should be noted that the second patterned photoresist layer 30' is complementary to the patterned photoresist layer 22 (as shown in FIG. 1). The term "complementary" as used herein means that both the patterned photoresist layer 22 and the second patterned photoresist layer 30' can be combined into a complete photoresist coating layer as viewed from the top view or the cross-sectional view. In other words, the position of the second patterned photoresist layer 30' corresponds to the portion of the opening 24 of the patterned photoresist layer 22 (as shown in FIG. 1). In actual production, a same photomask can be used to form the patterned photoresist layer 22 and the second patterned photoresist layer 30', and two different photoresists (e.g., positive photoresists and negative photoresists, respectively, or negative photoresists and positive photoresists, respectively) can be used to form the photoresist layer with complementary patterns.

Referring to FIG. 12 to FIG. 13, as shown in FIG. 12, an etching step E2 is performed, using the second patterned photoresist layer 30' as a protective layer to remove the insulating layer 28' not covered by the second patterned photoresist layer 30'. Next, as shown in FIG. 13, an etching step is performed again to remove the second patterned photoresist layer 30', in this step, the top surface of the remaining insulating layer 28' is preferably higher than the top surface of the passivation layer 32. The method for removing the insulating layer or the patterned photoresist layer includes but is not limited to photolithography, wet/dry etching, reactive ion etching (RIE), and the present invention is not limited thereto. However, it is worth noting that the above method does not include a planarization step (such as chemical mechanical polishing (CMP)). Since the method of removing the insulating layer or the patterned photoresist layer belongs to the known technology in the art, it will not be described in detail here.

As shown in FIG. 14, an etching step E3 is performed to reduce the height of the insulating layer 28'. By adjusting the parameters of the etching back step E3, the height of the insulating layer 28' after etching can be controlled. Preferably, adjusting the height of the insulating layer 28' to be aligned with the top surface of the passivation layer 32 is conducive to improving the yield of the insulating structure for subsequent fabrication of a high electron mobility transistor (HEMT).

Subsequently, other processes can be continuously performed on the semiconductor structure that has completed the insulation region, such as forming the gate, source/drain, contact structure, etc. corresponding to the high electron mobility transistor. Since these processes are known in the art, they will not be described in detail here.

Therefore, in one embodiment of the present invention, as shown in FIG. 14, an insulating structure of a high electron mobility transistor (HEMT) is provided, which includes a gallium nitride layer 14, an aluminum gallium nitride layer 16, a groove 26 on the gallium nitride layer 14, a passivation layer 32' in the gallium nitride layer 14 and the aluminum gallium nitride layer 16, Located on the aluminum gallium nitride 16 and in the groove 26, and an insulating layer 28' is located in the groove 26 and fills the groove, wherein a top surface of the insulating layer 28' is aligned with a top surface of the passivation layer 32'.

In some embodiments, a two-dimensional electron gas layer 18 is included between a portion of gallium nitride layer 14 and a portion of aluminum gallium nitride layer 16.

In some embodiments, wherein the two-dimensional electron gas layer 18 is not located in the insulating layer 28'.

In some embodiments, a buffer layer 12 is further included below the gallium nitride layer 14.

In some embodiments, the range of grooves 26 includes a portion of gallium nitride layer 14, a portion of aluminum gallium nitride layer 16, and a portion of buffer layer 12.

In some embodiments, the passivation layer 32' and the insulating layer 28' are made of different materials.

Combining the above first preferred embodiment with the second preferred embodiment, the present invention provides a method for forming an insulating structure of a high electron mobility transistor (HEMT), comprising: first, forming a gallium nitride layer 14, forming an aluminum gallium nitride layer 16 on the gallium nitride layer 14, then forming a patterned photoresist layer 22 on the aluminum gallium nitride layer 16. Afterwards, a groove 26 is formed in the gallium nitride layer 14 and the aluminum gallium nitride layer 16, then an insulating layer (28, 28') is formed and the groove 26 is filled, next, a second patterned photoresist layer (30, 30') is formed on the insulating layer (28, 28'), wherein the pattern of the patterned photoresist layer 22 is complementary to the pattern of the second patterned photoresist layer, then part of the insulating layer (28, 28') is removed, then the second patterned photoresist layer (30, 30') is removed, and an etching step E3 is performed on the remaining insulating layer to remove part of the insulating layer (28, 28').

In some embodiments, a same photomask is used in forming the patterned photoresist layer 22 and forming the second patterned photoresist layer (30, 30').

In some embodiments, different photoresists (e.g., positive photoresists and negative photoresists, or negative photoresists and positive photoresists) are used in forming the patterned photoresist layer 22 and forming the second patterned photoresist layer (30, 30').

In some embodiments, after the etching back step E3 is performed, a passivation layer 32 is further formed on the remaining insulating layer 28.

In some embodiments, after the etching back step E3 is performed, a top surface of the remaining insulating layer 28 is aligned with a top surface of the aluminum gallium nitride layer 16.

In some embodiments, a passivation layer 32' is formed in the groove after the groove 26 is formed and before the insulating layer 28 is formed.

In some embodiments, wherein after the etching back step E3, a top surface of the remaining insulating layer 28' is aligned with a top surface of the passivation layer 32'.

The present invention is characterized by providing an insulating structure of a high electron mobility transistor (HEMT) and a method for forming the same, wherein an insulating layer of the high electron mobility transistor having a flat surface is formed only by photolithography etching instead of a planarization step (e.g., chemical mechanical polishing). In the absence of a planarization machine, a high electron mobility transistor with high yield can still be fabricated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An insulating structure of a high electron mobility transistor (HEMT), comprising:
   a gallium nitride layer;
   an aluminum gallium nitride layer on the gallium nitride layer;
   a buffer layer disposed below the gallium nitride layer;
   two grooves located in the gallium nitride layer and the aluminum gallium nitride layer, wherein a bottom surface of each groove is aligned with a bottom surface of the buffer layer;
   an insulating layer located in the two grooves; and
   a mask layer disposed on the aluminum gallium nitride layer and disposed beside the insulating layer, wherein a top surface of the insulating layer is higher than a top surface of the mask layer, and wherein the insulating layer does not cover on the top surface of the mask layer.

2. The insulating structure of a high electron mobility transistor (HEMT) of claim 1, wherein a two-dimensional electron gas (2DEG) layer is contained between part of the gallium nitride layer and part of the aluminum gallium nitride layer.

3. The insulating structure of a high electron mobility transistor (HEMT) of claim 2, wherein the two-dimensional electron gas layer is not located in the insulating layer.

4. The insulating structure of a high electron mobility transistor (HEMT) of claim 1, wherein the range of the groove comprises part of the gallium nitride layer, part of the aluminum gallium nitride layer and part of the buffer layer.

* * * * *